US011443940B2

(12) United States Patent
Roy et al.

(10) Patent No.: US 11,443,940 B2
(45) Date of Patent: Sep. 13, 2022

(54) APPARATUS FOR UNIFORM LIGHT INTENSITY AND METHODS OF USING THE SAME

(71) Applicant: CANON KABUSHIKI KAISHA, Tokyo (JP)

(72) Inventors: Nilabh K. Roy, Austin, TX (US); Mario Johannes Meissl, Austin, TX (US); Masaki Saito, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 15 days.

(21) Appl. No.: 16/910,586

(22) Filed: Jun. 24, 2020

(65) Prior Publication Data

US 2021/0407797 A1 Dec. 30, 2021

(51) Int. Cl.
*H01L 21/02* (2006.01)

(52) U.S. Cl.
CPC .. *H01L 21/02348* (2013.01); *H01L 21/02282* (2013.01)

(58) Field of Classification Search
CPC .............. H01L 21/02348; H01L 21/02282
See application file for complete search history.

(56) References Cited

U.S. PATENT DOCUMENTS

| 6,702,648 | B1 * | 3/2004 | Avanzino | B24B 37/013 |
| | | | | 451/287 |
| 6,756,307 | B1 * | 6/2004 | Kelly | B23H 5/08 |
| | | | | 205/640 |
| 7,179,079 | B2 * | 2/2007 | Sreenivasan | B29C 43/003 |
| | | | | 425/177 |
| 7,303,383 | B1 | 12/2007 | Sreenivasan et al. | |
| 7,377,765 | B2 | 5/2008 | Bandic et al. | |

(Continued)

FOREIGN PATENT DOCUMENTS

| JP | 2006264253 A | 10/2006 |
| JP | 4928963 B2 | 5/2012 |
| WO | 2005032791 A1 | 4/2005 |

OTHER PUBLICATIONS

Colburn, M. et al., "Step and Flash Imprint Lithography: A New Approach to High-Resolution Patterning," Proc. SPIE 3676, Emerging Lithographic Technologies III, 1999, 11 pages.
Jeon, J-W et al., "A New Three-Dimensional Lithography Using Polymer Dispersed Liquid Crystal (PDLC) Films," Department of Electrical Engineering and Computer Science, MEMS, 2006, pp. 110-113.
Jeon, J-W et al., "Sloping Profile and Pattern Transfer to Silicon by Shape-Controllable 3-D Lithography and ICP," Department of Electrical Engineering and Computer Science, Sensors and Actuators A 139, 2007, pp. 281-286.

(Continued)

*Primary Examiner* — Mohammed Shamsuzzaman
(74) *Attorney, Agent, or Firm* — Abel Schillinger, LLP

(57) ABSTRACT

A system and method of forming a planarization layer on a substrate is disclosed. The method can include holding a superstrate with a superstrate chuck, the superstrate chuck positioned relative to a diffusing element, where the diffusing element includes a pattern and the superstrate chuck includes one or more geometric features, and where the pattern of the diffusing element aligns with the one or more geometric features of the superstrate chuck. The method can also include dispensing a formable material over the substrate, contacting the formable material over the substrate with a superstrate, providing a set of beams that pass through the diffusing element to cure the formable material over the substrate and form a layer over the substrate while the superstrate is contacting the formable material.

13 Claims, 6 Drawing Sheets

(56) References Cited

U.S. PATENT DOCUMENTS

| | | | | |
|---|---|---|---|---|
| 7,906,180 | B2* | 3/2011 | Xu | B82Y 40/00 427/387 |
| 8,303,291 | B2 | 11/2012 | Kirchner et al. | |
| 2002/0094496 | A1* | 7/2002 | Choi | B82Y 40/00 430/322 |
| 2003/0073310 | A1* | 4/2003 | Olgado | H01L 21/6708 438/689 |
| 2006/0012770 | A1* | 1/2006 | Dierichs | G03F 7/70075 355/71 |
| 2007/0023853 | A1 | 2/2007 | Partain et al. | |
| 2007/0190196 | A1* | 8/2007 | Bandic | B82Y 40/00 425/174.4 |
| 2008/0105355 | A1* | 5/2008 | Kumar | G01R 3/00 156/60 |
| 2011/0014499 | A1 | 1/2011 | Uchida et al. | |
| 2011/0041910 | A1* | 2/2011 | Shimomura | H01L 31/1892 136/256 |
| 2011/0070462 | A1 | 3/2011 | Uchida et al. | |
| 2011/0180965 | A1 | 7/2011 | Zhang et al. | |
| 2011/0216523 | A1 | 9/2011 | Tong et al. | |
| 2012/0313295 | A1* | 12/2012 | Den Boef | B82Y 40/00 264/406 |
| 2016/0318066 | A1* | 11/2016 | Sreenivasan | G02B 1/111 |
| 2017/0333940 | A1* | 11/2017 | Sreenivasan | B81C 1/00611 |
| 2018/0247823 | A1* | 8/2018 | LaBrake | H01L 21/02282 |
| 2019/0377259 | A1* | 12/2019 | Kimura | B29C 59/00 |
| 2020/0219765 | A1* | 7/2020 | Chen | G03F 7/0757 |
| 2021/0050218 | A1* | 2/2021 | Ozturk | B28D 5/0047 |
| 2021/0125855 | A1* | 4/2021 | Roy | H01L 21/68785 |
| 2021/0271161 | A1* | 9/2021 | Roy | G03F 7/0002 |
| 2021/0373437 | A1* | 12/2021 | Cone | G03F 7/0002 |

OTHER PUBLICATIONS

Mckenna, L. et al., "Polymer Dispersed Liquid Crystal Films for Modulating Infra-Red Radiation," Department of Electrical and Electronic Engineering, Polymer 45, 2004, pp. 6977-6984.

Natarajan, L. V. et al., "Switchable Holographic Polymer-Dispersed Liquid Crystal Reflection Gratings Based on Thiol-Ene Photopolymerization," Air Force Research Laboratory, Materials and Manufacturing Directorate, Chem. Materials, 2003, 15, pp. 2477-2484.

Ren, H. et al., "Tunable Fresnel Lens Using Nanoscale Polymer-Dispersed Liquid Crystals," School of Optics, Applied Physics Letters, vol. 83, No. 8, 2003, pp. 1515-1517.

Spruce, G. et al., "Polymer Dispersed Liquid Crystal (PDLC) Films," Electronics & Communication Engineering Journal, 1992, pp. 91-100.

Sreenivasan, S. V. et al., "Low-Cost Nanostructure Patterning Using Step and Flash Imprint Lithography," Proceedings of SPIE—The International Society for Optical Engineering, vol. 4608, 1992, pp. 187-194.

Takei, S. et al., "Nanoparticle Free Polymer Blends for Light Scattering Films in Liquid Crystal Displays," Applied Physics Letters, vol. 100, 2012, pp. 263108-1-263108-4.

Curie, M. et al. "Customized low-angle refractive diffusers for high power laser applications," PowerPhotonic Ltd., Dalgety Bay, KY119PF, Scotland, UK; 2016, 10 pages.

* cited by examiner

APPARATUS FOR UNIFORM LIGHT INTENSITY AND METHODS OF USING THE SAME

FIELD OF THE DISCLOSURE

The present disclosure relates to substrate processing, and more particularly to whole wafer fluid deposition in semiconductor fabrication.

RELATED ART

Fluid deposition techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer. Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed.

However, defects can arise as collimated light is deflected by the superstrate chuck prior to reaching the polymerizable material. As such, improvements in fluid processing techniques are desired to allow for whole wafer processing.

SUMMARY

In an aspect a system for planarizing a substrate is disclosed. The system can include a substrate chuck to hold the substrate, and a superstrate chuck to hold a superstrate, where the superstrate chuck can include one or more geometric features. The system can also include a diffusing element, where the diffusing element comprises a pattern aligned with the one or more geometric features of the superstrate chuck.

In another aspect, the system can further include a radiation source to provide actinic radiation beams to the substrate through the diffusing element, the superstrate chuck, and the held superstrate, where the diffusing element can be between the radiation source and the superstrate chuck.

In yet another aspect, the diffusing element has a first surface and a second surface opposite the first surface, and where the pattern of the diffusing element can be on the first surface of the diffusing element.

In yet another aspect, the diffusing element can include a first portion and a second portion, and where collimated light exiting the first portion can exit as collimated beams and collimated light exiting the second portion can exit as diffused beams.

In yet another aspect, the second portion can include the pattern.

In another aspect, the system can further include a camera and a lighting system to align the superstrate with the substrate In a further aspect, the diffusing element is integrated with the superstrate chuck.

In another aspect, the diffusing element can be between the camera and lighting system, and the superstrate chuck.

In another aspect, the first portion can have a surface roughness that is less than a surface roughness of the second portion.

In yet another aspect, the second portion of the diffusing element can have a surface roughness of between 0.1 µm to 1 µm Ra.

In another aspect, the pattern of the diffusing element can include between 0.1% and 30% of a total surface area of the first surface of the diffusing element.

In yet another aspect, the pattern can be localized to cover over only the one or more geometric features of the superstrate chuck.

In a further aspect, the pattern can extend circumferentially towards a center of the diffusing element.

In yet another aspect, the pattern can include one or more areas on the diffusing element.

In another aspect, the diffusing element is integral with the superstrate chuck.

In another aspect, a method of forming a planarization layer on a substrate is disclosed. The method can include holding a superstrate with a superstrate chuck, the superstrate chuck positioned relative to a diffusing element, where the diffusing element can include a pattern and the superstrate chuck can include one or more geometric features, and where the pattern of the diffusing element aligns with the one or more geometric features of the superstrate chuck, dispensing a formable material over a substrate, contacting the formable material over the substrate with the superstrate, and providing a set of beams that pass through the diffusing element to cure the formable material over the substrate and form a layer over the substrate while the superstrate is contacting the formable material.

In another aspect, wherein the diffusing element comprises a first portion and a second portion and wherein the pattern is in the second portion.

In yet another aspect, wherein the set of beams that pass through the diffusing element enter the diffusing element at a first state and exit the diffusing element at a second state.

In a further aspect, the set of beams that enter the second portion enter as collimated beams and exit as diffused beams.

In yet another aspect, a method of manufacturing an article is disclosed. The method of manufacturing an article can include holding a superstrate with a superstrate chuck, the superstrate chuck positioned relative to a diffusing element, where the diffusing element can include a pattern and the superstrate chuck can include one or more geometric features, and where the pattern of the diffusing element aligns with the one or more geometric features of the superstrate chuck, dispensing a formable material over a substrate, contacting the formable material over the substrate with the superstrate, providing a set of beams that pass through the diffusing element to cure the formable material over the substrate and form a layer over the substrate while the superstrate is contacting the formable material, separating the superstrate and the layer on the substrate, processing the substrate on which the layer has been formed, and manufacturing the article from the processed substrate.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

Figure 1:
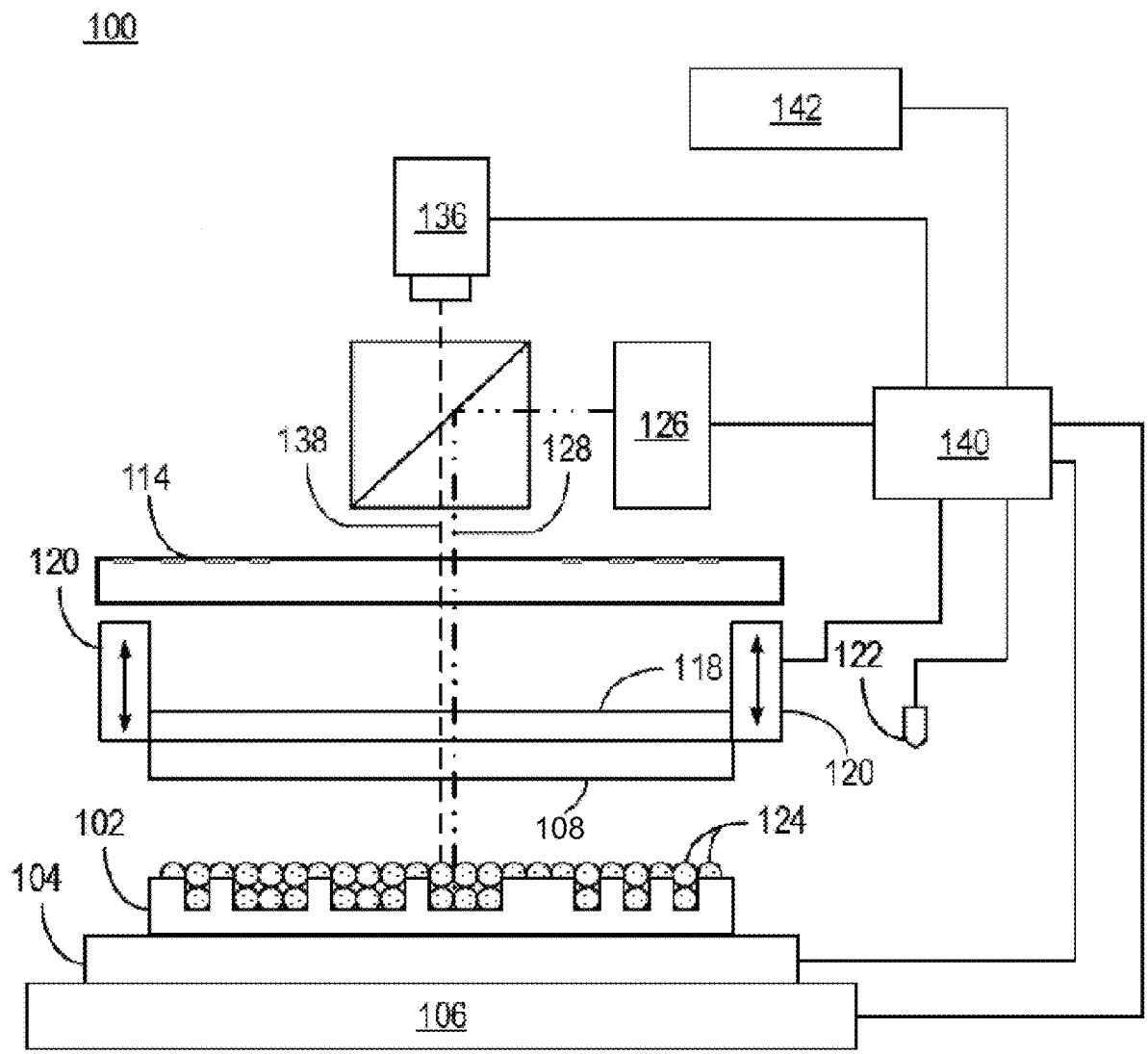
FIG. 1 includes an illustration of a side view of an exemplary system.

Referring to FIG. 1, an apparatus 100 in accordance with an embodiment described herein can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Figure 2A:
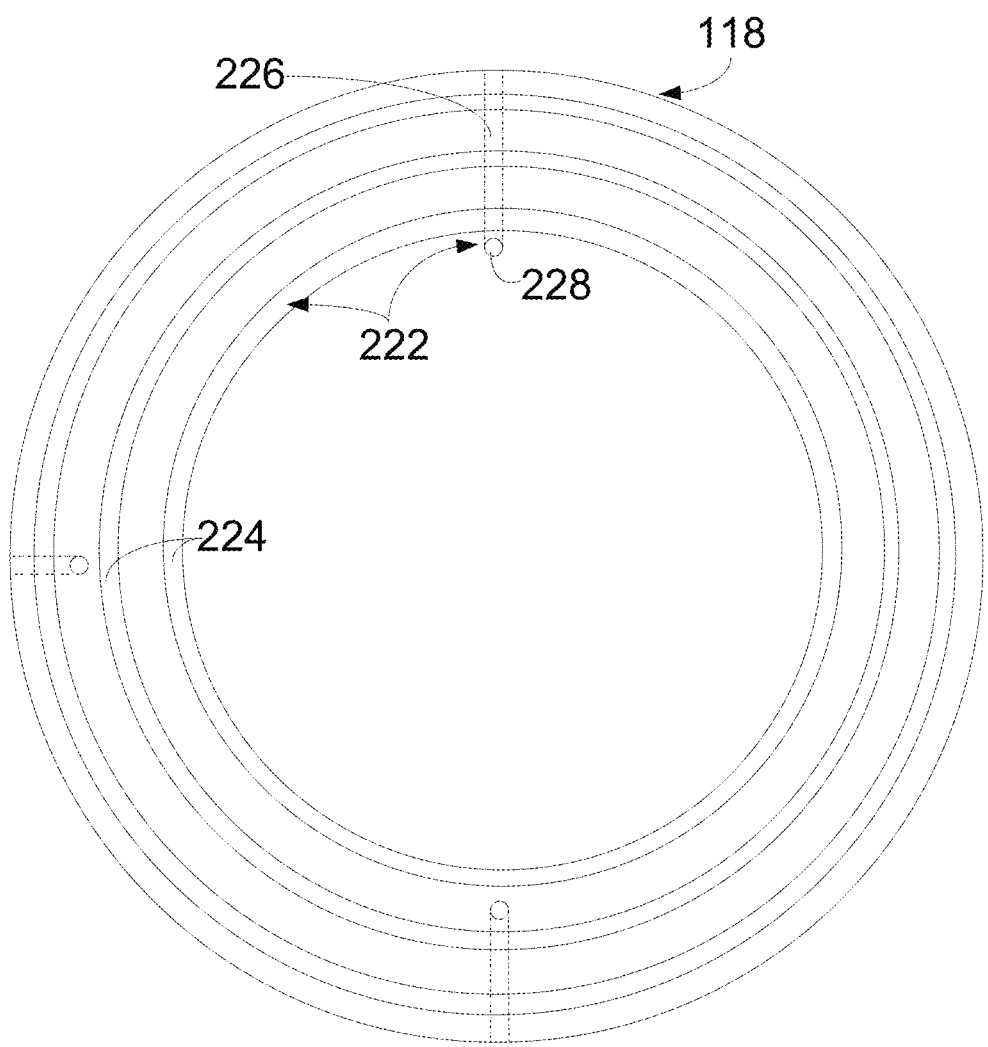
FIG. 2A includes an illustration of a bottom view of a superstrate chuck.

Spaced apart from the substrate 102 is a superstrate 108. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light. Superstrate 108 can have a working surface 112 facing substrate 102, as seen in FIG. 2A. Surface 112 is generally of the same areal size or slightly smaller as the surface of the substrate 102. Surface 112 of superstrate 108 can include a planar contact surface. In another embodiment, the contact surface of superstrate 108 can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the superstrate 108 to bend and deform.

The superstrate chuck 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The apparatus 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense a formable material 124, such as a UV-curable composition for use as a planarizing material. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 may further comprise a camera 136 positioned to view the spread of formable material 124 as the superstrate 108 contacts the formable material 124 during the planarization process. FIG. 1 illustrates an optical axis path 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may further comprise a curing system that includes a radiation source 126 that directs actinic energy, for example, UV radiation, along an exposure path 128. The planarization head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 124. The radiation source 126 directs the actinic energy along the exposure path 128 through the superstrate chuck 118. Since the superstrate chuck 118 can contain several different geometric features, such as lands, channels, ports, cavities, or other features that have sharp edges that lead to Fresnel diffraction and/or that have rounded edges that change the direction or focus of the transmitted light, the light transmissivity through such geometric features is different from the light transmissivity through the planar areas of the superstrate chuck 118 when a collimated or a directed beam is passed through these features.

Accordingly, the variation in light transmissivity leads to non-uniform curing of the formable material in areas under these features. For example, Fresnel diffraction can lead to spikes of greater light intensity at areas under the features, whereas the re-direction or re-focusing of light due to rounded edges can result in lower intensity of light reaching areas under the features. This in turn leads to non-uniformity of curing and subsequent poor planarization results, including but not limited to non-uniformity in mechanical strength, etch performance, or other properties of the planarized layer. However, the effects seen from such features can be reduced by making the energy reaching the transparent chuck diffused in nature. It is to be noted however, that the total areal expanse of these geometric features on the superstrate chuck is much smaller than the total area of the superstrate chuck. The size of geometric features illustrated in the figures is not to scale and are exaggerated for easier visualization and understanding of this invention.

Figure 2B:
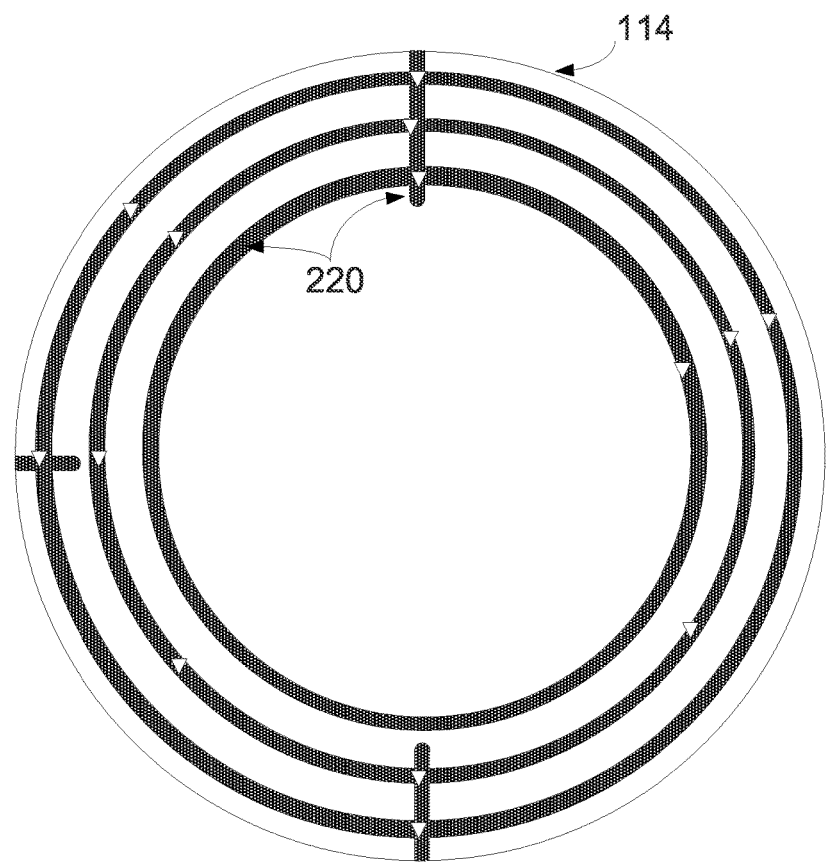
FIG. 2B includes an illustration of a top view of a diffusing element.

As can be seen in FIG. 1, the optical axis path 138 can go through a diffusing element 114 prior to reaching the superstrate chuck 118 holding the superstrate 108. In one embodiment, the diffusing element can have a localized pattern 220, as shown in FIG. 2B and described in more detail below. The diffusing element 114 can scatter light locally and in a selective pattern as the light passes through the diffusing element 114. In one embodiment, the selective pattern 220 can correspond to the presence and positioning of geometric features on the superstrate chuck 118, such as channels, lands, ports, and more. In one embodiment, the exposure path 128 can be a collimated light prior to reaching a diffusing element 114 and then the localized exposure paths can become diffused light after passing through the selective pattern of diffusing element 114. The diffusing element can diffuse the actinic energy prior to reaching the curable material thereby providing a more uniform distribution of curing light to the curable material. The remaining regions of the diffusing element 114 can be transparent, such that the light passing through these remaining regions remains collimated. In such a manner, the diffusing element 114 can locally diffuse the actinic energy passing through locations corresponding to the geometric features of the superstrate chuck 118 prior to reaching the curable material positioned under such features. In doing so, the variation in light transmissivity passing through the geometric features of the superstrate is reduced thereby providing a more uniform distribution of curing light to the curable material.

As such, the diffusing element 114 can have one or more scatter ranges associated with different local geometric features of the superstrate chuck—defined by the exiting angle variation, i.e. the difference in angles between a minimum angle and a maximum angle as beams exit the localized diffusing element 114—of greater than 5 degrees and less than 180 degrees after passing through the diffusing element 114. While FIG. 1 does not show the superstrate 108 in contact with the formable material 124, this is done for illustrative purposes so that the relative position of the individual components can be easily identified, it should be understood that the diffusing element 114 can diffuse the actinic energy when the superstrate 108 is in contact with the formable material 124, thereby diffusing the actinic energy after passing through the diffusing element 114. In one embodiment, the exposure path 128 can be a collimated light upon reaching the diffusing element 114 with the light advantageously diffused light when passing through a first portion of the diffusing element 114 and remaining collimated when passing through a second portion of the diffusing element. Since there are areas in the diffusing element 114 that allow collimated light to pass through it unchanged, the system advantageously provides for the camera 136 to maintain focus to view the spread of formable material 124 underneath the superstrate 108.

The diffusing element 114 can include a localized pattern 220 (see FIG. 2B). In one embodiment, the localized pattern 220 can include one or more regions with different surface roughness. In one embodiment, the localized pattern 220 can be on a first surface of the diffusing element and the first surface can be facing the camera 136. In another embodiment, the pattern 220 can be on a second surface of the diffusing element, where the second surface is opposite the first surface, and where the second surface can be facing the superstrate chuck 118. In another embodiment, the diffusing element can be integrally formed with the superstrate chuck. In one embodiment, the pattern 220 can be discontinuous. In another embodiment, the diffusing element 114 can include a first portion and a second portion, where a first optical divergence of collimated light exiting the first portion is less than a second optical divergence of diffused light exiting the second portion, where the second portion is pattern that to corresponds to one or more geometric features of the superstrate chuck 118. In one embodiment, the first portion has a surface roughness that is less than a surface roughness of the second portion. In one embodiment, the second portion of the diffusing element 114 can include a surface roughness of between 0.1 µm to 1 µm Ra. In one embodiment, the second portion of the diffusing element 114, with a higher surface roughness, can correspond to and align with the geometric features of the superstrate chuck 118. In another embodiment, the sizes of the second portion, with higher surface roughness, are larger than the geometric feature size of the superstrate chuck 118 to allow for easier alignment between diffusing element 114 and the superstrate chuck 118. In another embodiment, the size of these second portion regions can be determined and computed using the relative distance of the element 114 with respect to the superstrate and the divergence angle estimate of the output beams from the second portion regions. These estimations can be trigonometrical estimates and can be understood by a person skilled in the art. In one embodiment, the diffusing element 114 can diffuse the actinic light in a targeted fashion. In other words, the surface roughness may diffuse the actinic light locally instead of globally. In one embodiment, the diffusing element 114 can vary the extent of diffusion by varying the surface roughness of the diffusing element. In one embodiment, the actinic energy can be diffused after passing through the diffusing element 114 thereby reaching the formable material at different angles and thereby curing the formable material in a more uniform pattern. Specifically, while the superstrate 108 is in contact with the substrate 102, the energy passing through the diffusing element 114 can be diffused to provide a more uniform curing process.

In one embodiment, the diffusing element 114 can be between an optical element and the superstrate chuck 118. In one embodiment, the diffusing element 114 can be between the camera 136 and the substrate 102. In another embodiment, the diffusing element 114 can be adjacent to the planarizing head 120. The diffusing element 114 can direct one or more light beams through the superstrate 108. In one embodiment, the diffusing element can have a width that is wider than the width of the superstrate chuck 118.

The apparatus 100 may be regulated, controlled, and/or directed by one or more processors 140 (controller) in communication with one or more components and/or subsystems such as the substrate chuck 104, the substrate positioning stage 106, the superstrate chuck 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an Internet connected non-transitory computer readable storage device.

In operation, either the planarization head 120 or the substrate position stage 106, or both vary a distance between the superstrate 108 and the substrate 102 to define a desired space (a bounded physical extent in three dimensions) that is filled with the formable material 124. For example, the planarization head 120 may be moved toward the substrate and apply a force to the superstrate 108 such that the superstrate 108 contacts and spreads droplets of the formable material 124 as further detailed herein.

Figure 2C:
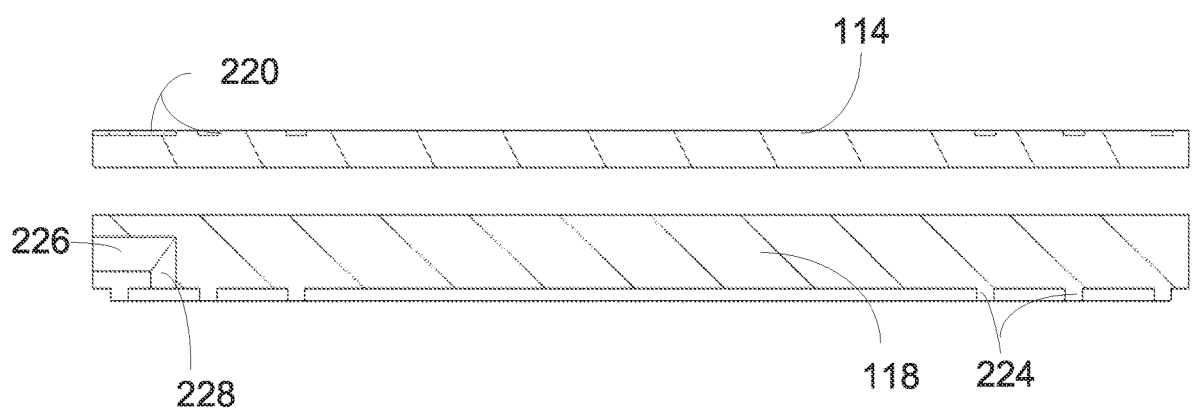
FIG. 2C includes an illustration of a cross-sectional view of the diffusing element of FIG. 2C placed over the superstrate chuck of FIG. 2A.

FIG. 2A includes an illustration of a bottom view of superstrate chuck 118 which includes exemplary geometric features 222, such as lands 224, channels 226, and ports 228. FIG. 2B includes an illustration of a top view of the diffusing element 114. FIG. 2C includes an illustration of a cross-sectional view of the diffusing element of FIG. 2B placed over the superstrate chuck of FIG. 2A. As seen in FIG. 2C, the diffusing element 114 includes a pattern 220. In one embodiment the pattern 220 can be discontinuous. In one embodiment, the pattern 220 can be on a first surface of the diffusing element, where the first surface faces the camera. In another embodiment, the pattern 220 can be on a second surface of the diffusing element 114, where the second surface is opposite the first surface and where the second surface faces the superstrate chuck 118. In another embodiment, the diffusing element 114 is integrated with the superstrate chuck 118. In one embodiment, the pattern 220 can include one or more regions of the surface area of the diffusing element 114. In one embodiment, the one or more regions can be spaced apart on the surface of the diffusing element 114. The pattern 220 can correspond to and align with geometric features 222 on the superstrate chuck 118, as seen in FIGS. 2B and 2C. The geometric features 222 on the superstrate chuck 118 can include lands 224, channels 226, ports 228, or other features that include sharp edges that lead to Fresnel diffraction and/or that include rounded edges that change the direction or focus of the transmitted light. In such event, when a collimated or a directed beam is passed through these geometric features, the light transmissivity is altered relative to the light transmissivity through the adjacent relatively planar areas of the superstrate chuck 118. That is, Fresnel diffraction can lead to spikes of greater light intensity at areas under the features, whereas the re-direction or re-focusing of light due to rounded edges can result in lower intensity of light reaching areas under the features. Accordingly, this variation in light transmissivity leads to non-uniform curing of the material, leading in turn to poor planarization results, including but not limited to non-uniformity in mechanical strength, etch performance, or other properties of the planarized layer. However, the effects seen from such geometric features can be reduced by making the energy reaching the geometric features itself diffused in nature. As such, the diffusing element 114 contain a pattern 220 that corresponds to the geometric features 222 of the superstrate chuck 118 and diffuses light beams going through such patterned areas. The diffused beams then pass through the chuck features at varying incident angles as compared to a collimated beam having a single angle of incidence. These varying incident angles reduce both the Fresnel diffraction effect due to sharp edges and the re-direction/re-focusing effect due to rounded edges which lessens the non-uniformity of light intensity reaching the curable material positioned under superstrate in proximity to the superstrate features. As a result, more uniform curing of the curable material on the substrate is achieved. It is to be noted however, that the total areal expanse of these sharp geometric features on the superstrate is much smaller than the total area of the superstrate. The size of geometric features illustrated in the figures is not to scale and are exaggerated for easier visualization and understanding of this invention. Accordingly, the pattern on the diffusing element 114 can be between 0.1% and 30% of the total surface area of the diffusing element. In one embodiment, the pattern can be between 1% and 15% of the total surface area of the diffusing element.

Figure 3A:
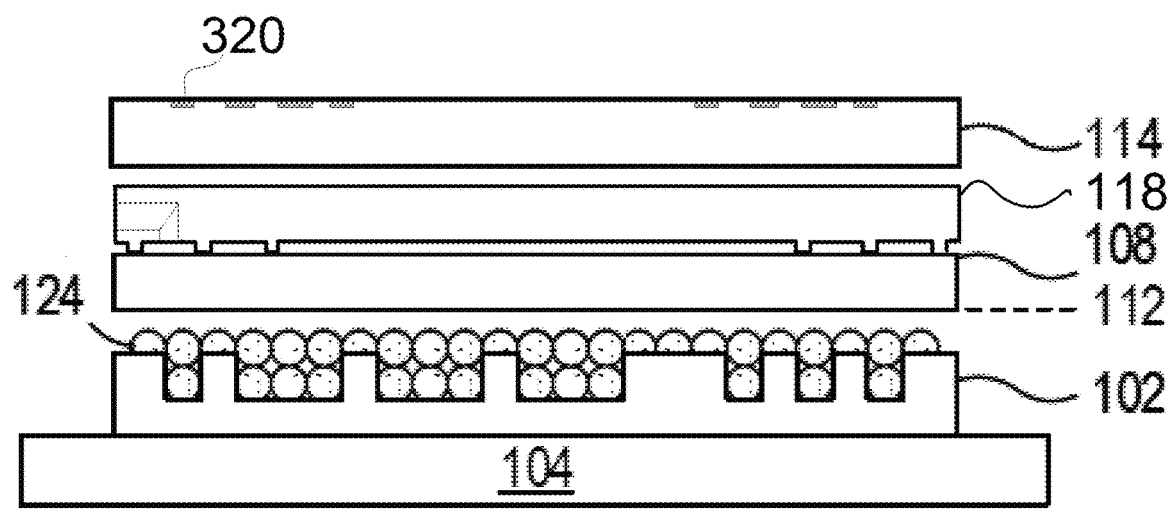
FIGS. 3A to 3C include an illustration of a planarization process.
Figure 3B:
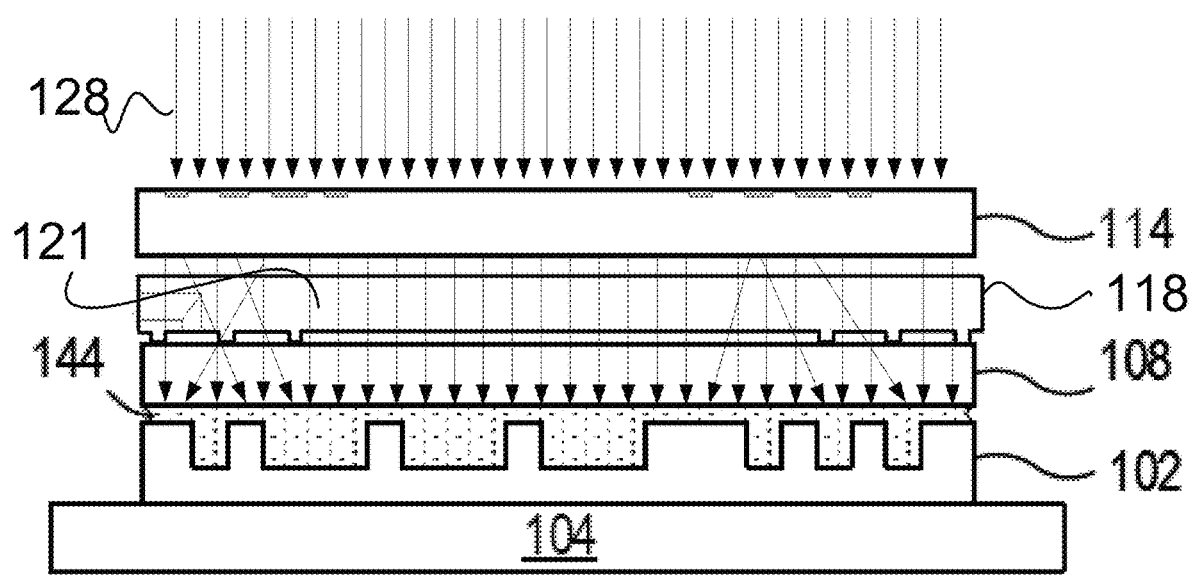
Figure 3C:
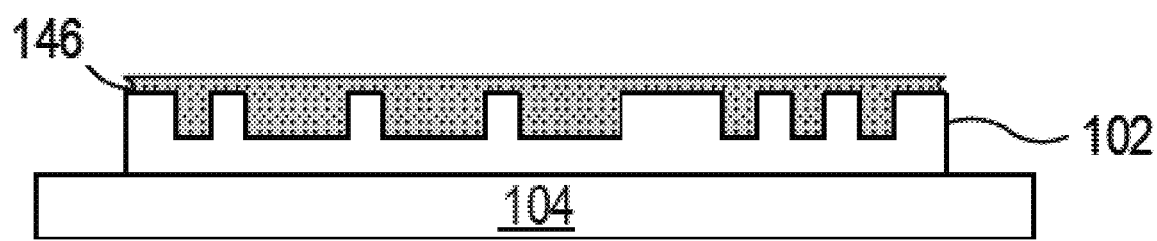

The planarization process includes steps which are shown schematically in FIGS. 3A-3C. As illustrated in FIG. 3A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. As previously explained, the diffusing element 114 includes a localized pattern 220 that aligns with geometric features 222 on the superstrate chuck 118. In one embodiment, the pattern 220 comprises one or more areas of surface roughness. In one embodiment, the surface roughness can vary from one region to the next within the pattern 320. In another embodiment, the pattern 320 can be discontinuous.

FIG. 3B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. As seen in FIG. 3B, the diffusing element 114 can scatter actinic beams 128 at the localized pattern 220 while collimated beams enter and exit the diffusing element 114 relatively unchanged in areas without the pattern. The actinic beams 121 can enter as collimated beams and exit the diffusing element 114 at the regions with the pattern 220 at various different angles. As previously described, by diffusing or scattering the beams at the localized areas of pattern 220 corresponding to the geometric features 222 of the superstrate chuck during the curing process, the diffusing element 114 provides a more uniform polymerization process.

Once cured, planarized layer 146 is formed, and the superstrate 108 can be separated therefrom. FIG. 3C illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Figure 4:
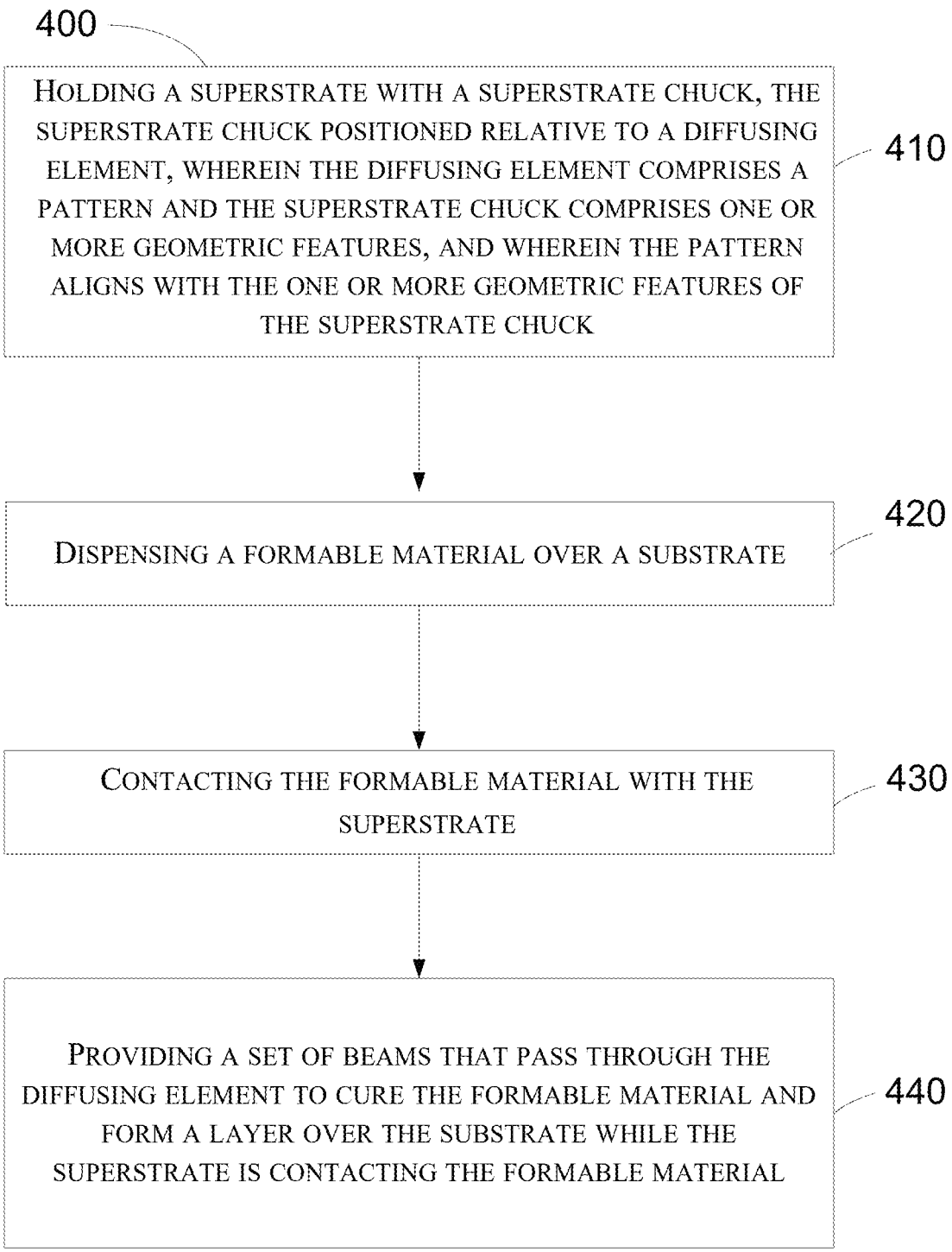
FIG. 4 includes an illustration of a method 400 of the present disclosure, according to one embodiment.

FIG. 4 includes an illustration of a method 400 of the present disclosure, according to one embodiment. The method can begin at operation 410 by holding a superstrate 108 with a superstrate chuck 118. The superstrate chuck 118 can be positioned relative to a diffusing element 114. The diffusing element 114 can include a pattern and the superstrate chuck includes one or more geometric features, and where the pattern 220 aligns with the one or more geometric features of the superstrate chuck 118. In one embodiment, the method can include aligning the substrate 102 with the superstrate 108 using the camera 136. The diffusing element 114 can allow collimated beams to pass through the areas that are not patterned relatively unchanged. By doing so the camera can be used to view the substrate below the superstrate 108.

The method continues at operation 420 by dispensing a formable material 124 over a substrate 102. The substrate 102 can include a non-uniform surface topography. In other words, a surface of the substrate 102 may be non-uniform. The formable material 124 can include a polymerizable material, such as a planarizing material. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof. The formable material 124 can be dispensed upon the substrate 102 before or after a desired volume is defined between the superstrate 108 and the substrate 102.

At operation 430, the superstrate 108 can contact the formable material 124. As the superstrate 108 contacts the formable material 124, any trapped gas particles can dissipate through the curing layer, the substrate or the superstrate 108. In one embodiment, the superstrate 108 can have a body and an amorphous fluoropolymer layer, as described above.

At operation 440, system can provide a set of beams that pass through the diffusing element 114 to cure the formable material and form a layer over the substrate 102 while the superstrate 108 is in contact with the substrate 102. In one embodiment, the diffusing element 114 can diffuse the actinic radiation that enters the patterned areas of the diffusing element 114 such that the actinic radiation enters the diffusing element 114 in an entering state and exits the diffusing element 114 in an exiting state wherein the entering state is different from the exiting state. In one embodiment, the diffusing element 114 patterned area can include various surface roughness. In one embodiment the pattern 220 corresponds to the one or more features of the superstrate chuck. In one embodiment, where the beam is entering in an area of the diffusing element that is patterned, the entering state is as collimated beams and the exiting state is as diffused beams. In another embodiment, where the beam is entering an area of the diffusing element that is not patterned, the entering state is as collimated beams and the exiting state is as collimated beams. In one embodiment, the actinic radiation can be one or more light beams. The one or more light sources can be a probe-type light, such as a laser diode with beam shaping optics. In another embodiment, the one or more light sources can be a LED with DMD.

As the formable material 124 is cured, a layer is formed over the substrate 102. The formable material 124 can include a monomer or oligomer mixture that can be cured using ultraviolet light, heat, or the like. In one embodiment, curing is performed while the superstrate 108 is contacting the formable material 124. Following the curing, the superstrate 108 can be separated from the newly formed layer formed on the substrate 102.

In one embodiment a method of manufacturing an article can include placing a diffusing element 114 over a superstrate chuck 118, where the diffusing element 114 can include a pattern 220 and the superstrate chuck 118 can include one or more geometric features, and where the pattern 220 of the diffusing element 114 aligns with the one or more geometric features of the superstrate chuck 118 and dispensing a formable material 124 over a substrate 102. The substrate 102 can include a non-uniform surface topography. The method of manufacturing an article can also include contacting the formable material 124 over the substrate 102 with a superstrate 108, providing a set of beams that pass through the diffusing element 114 to cure the formable material 124 over the substrate 102 and form a layer over the substrate 102 while the superstrate 108 is contacting the formable material 124, separating the superstrate 108 and the layer on the substrate 102, processing the substrate 102 on which the layer has been formed, and manufacturing the article from the processed substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A system for planarizing a substrate, comprising:
   a substrate chuck to hold the substrate, wherein the substrate is configured to hold a formable material thereon;
   a superstrate chuck to hold a superstrate, wherein the superstrate chuck comprises one or more geometric features; and
   a diffusing element, wherein the diffusing element comprises a pattern aligned and corresponding with the one or more geometric features of the superstrate chuck, wherein the diffusing element is configured to allow actinic radiation beams to pass through to cure the formable material to form a layer and planarize the layer on the substrate;
   wherein the diffusing element comprises a first portion and a second portion, and wherein collimated light exiting the first portion exits as collimated beams and collimated light exiting the second portion exits as diffused beams; and
   wherein the first portion has a surface roughness that is less than a surface roughness of the second portion.

2. The system of claim 1, wherein the system further comprises a radiation source to provide the actinic radiation beams to the substrate through the diffusing element, the superstrate chuck, and a held superstrate, wherein the diffusing element is between the radiation source and the superstrate chuck.

3. The system of claim 1, wherein the diffusing element has a first surface and a second surface opposite the first surface, and wherein the pattern of the diffusing element is on the first surface of the diffusing element.

4. The system of claim 1, wherein the second portion comprises the pattern.

5. The system of claim 1, further comprising a camera and a lighting system to align the superstrate with the substrate.

6. The system of claim 1, wherein the diffusing element is integrated with the superstrate chuck.

7. The system of claim 5, wherein the diffusing element is between the camera and lighting system, and the superstrate chuck.

8. The system of claim 1, wherein the second portion of the diffusing element has a surface roughness of between 0.1 µm to µm Ra.

9. The system of claim 3, wherein the pattern of the diffusing element comprises between 0.1% and 30% of a total surface area of the first surface of the diffusing element.

10. The system of claim 9, wherein the pattern is localized to cover over only the one or more geometric features of the superstrate chuck.

11. The system of claim 9, wherein the pattern extends circumferentially towards a center of the diffusing element.

12. The system of claim 11, wherein the pattern comprises one or more areas on the diffusing element.

13. The system of claim 12, wherein the diffusing element is integral with the superstrate chuck.

* * * * *

UNITED STATES PATENT AND TRADEMARK OFFICE
CERTIFICATE OF CORRECTION

PATENT NO.            : 11,443,940 B2
APPLICATION NO.       : 16/910586
DATED                 : September 13, 2022
INVENTOR(S)           : Nilabh K. Roy et al.

It is certified that error appears in the above-identified patent and that said Letters Patent is hereby corrected as shown below:

In the Claims

In Column 12, Line 33, please delete "to µm Ra" and insert --to 1µm Ra.--

Signed and Sealed this
Thirty-first Day of October, 2023

Katherine Kelly Vidal
*Director of the United States Patent and Trademark Office*